United States Patent
Hong (10) Patent No.: US 6,756,618 B2
(45) Date of Patent: Jun. 29, 2004

(54) CMOS COLOR IMAGE SENSOR AND METHOD FOR FABRICATING THE SAME

(75) Inventor: Hee-Jeong Hong, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/334,065

(22) Filed: Dec. 31, 2002

(65) Prior Publication Data

US 2004/0094783 A1 May 20, 2004

(30) Foreign Application Priority Data

Nov. 4, 2002 (KR) .......................................... 2002-70768

(51) Int. Cl.[7] ...................... H01L 31/062; H01L 31/113
(52) U.S. Cl. ...................... 257/292; 257/440; 257/463; 257/464
(58) Field of Search ................................ 257/291, 292, 257/440, 463, 464

(56) References Cited

U.S. PATENT DOCUMENTS

| | | | | |
|---|---|---|---|---|
| 4,412,236 A | * | 10/1983 | Sasano et al. | 257/292 |
| 6,271,554 B1 | * | 8/2001 | Nozaki et al. | 257/292 |
| 6,359,323 B1 | * | 3/2002 | Eom et al. | 257/440 |
| 6,433,374 B1 | * | 8/2002 | Fukunaga et al. | 257/292 |
| 6,518,085 B1 | * | 2/2003 | Wang et al. | 257/440 |
| 6,548,833 B1 | * | 4/2003 | Lin et al. | 257/292 |
| 6,593,607 B1 | * | 7/2003 | Hseih | 257/292 |
| 6,608,338 B2 | * | 8/2003 | Rhodes | 257/292 |
| 6,639,293 B2 | * | 10/2003 | Furumiya et al. | 257/292 |

OTHER PUBLICATIONS

Bourdelle, Konstantin K. et al, IEEE, Transactions on Electron Devices, Sep. 2001, vol. 48, No. 9, pp. 2043–2049.

* cited by examiner

Primary Examiner—Gene M. Munson
(74) Attorney, Agent, or Firm—Birch, Kolasch, Stewart & Birch, LLP (57) ABSTRACT

The present invention relates to a complementary metal-oxide semiconductor (CMOS) image sensor. Particularly, the present invention provides effects of suppressing electrical and optical interferences and improving light sensitivity in a unit pixel of a highly integrated and low power consuming CMOS image sensor. In order to achieve these effects, a red pixel is two-dimensionally encompassed by a green pixel and a blue pixel formed with an additional p-type ion implantation region for suppressing the interference between the pixels. Also, in addition to the above-described structure, a photodiode optimized to the blue pixel is formed further to enhance the light sensitivity.

16 Claims, 5 Drawing Sheets

CMOS COLOR IMAGE SENSOR AND METHOD FOR FABRICATING THE SAME

FIELD OF THE INVENTION

The present invention relates to a complementary metal-oxide semiconductor (CMOS) image sensor; and, more particularly, to a CMOS image sensor with reduced interference and cross-talk phenomena occurring between closely located pixels by forming a differently structured photodiode in a pixel of a low power dissipation and high density CMOS image sensor and a method for fabricating the same.

DESCRIPTION OF RELATED ARTS

Image sensor is a semiconductor device converting an optical image into an electric signal. Particularly, a charge coupled device (CCD) is a device, wherein each metal-oxide-silicon (hereinafter referred as to MOS) capacitor is closely located and carriers are stored into the MOS capacitor and transferred. A complementary metal oxide semiconductor (hereinafter referred as to CMOS) image sensor employs CMOS technology that uses a control circuit and a signal processing circuit as peripheral circuits and adopts a switching mode sensing outputs sequentially. The MOS transistors are formed as the same number of existing pixels in the peripheral circuit.

There are several problems in using the CCD due to its complex driving mode, high power dissipation, a complex process having lots of steps for a mask process and a difficulty in one chip realization since the signal processing circuit cannot be constructed on a CCD chip. Therefore, there has been actively researched on the CMOS image sensor that uses sub-micron CMOS technology to overcome the above problems. The CMOS image sensor obtains an image by forming a photodiode and a MOS transistor in a unit pixel and then detecting signals sequentially through a switching mode. The use of the CMOS technology results in less power dissipation and an enabled one chip process for the signal processing circuit. Also, compared to the CCD process that requires approximately 30 to 40 masks, the CMOS image sensor implemented with the CMOS technology needs approximately 20 masks because of a simplified process. Hence, the CMOS image sensor is currently highlighted as a next generation image sensor.

Figure 1:
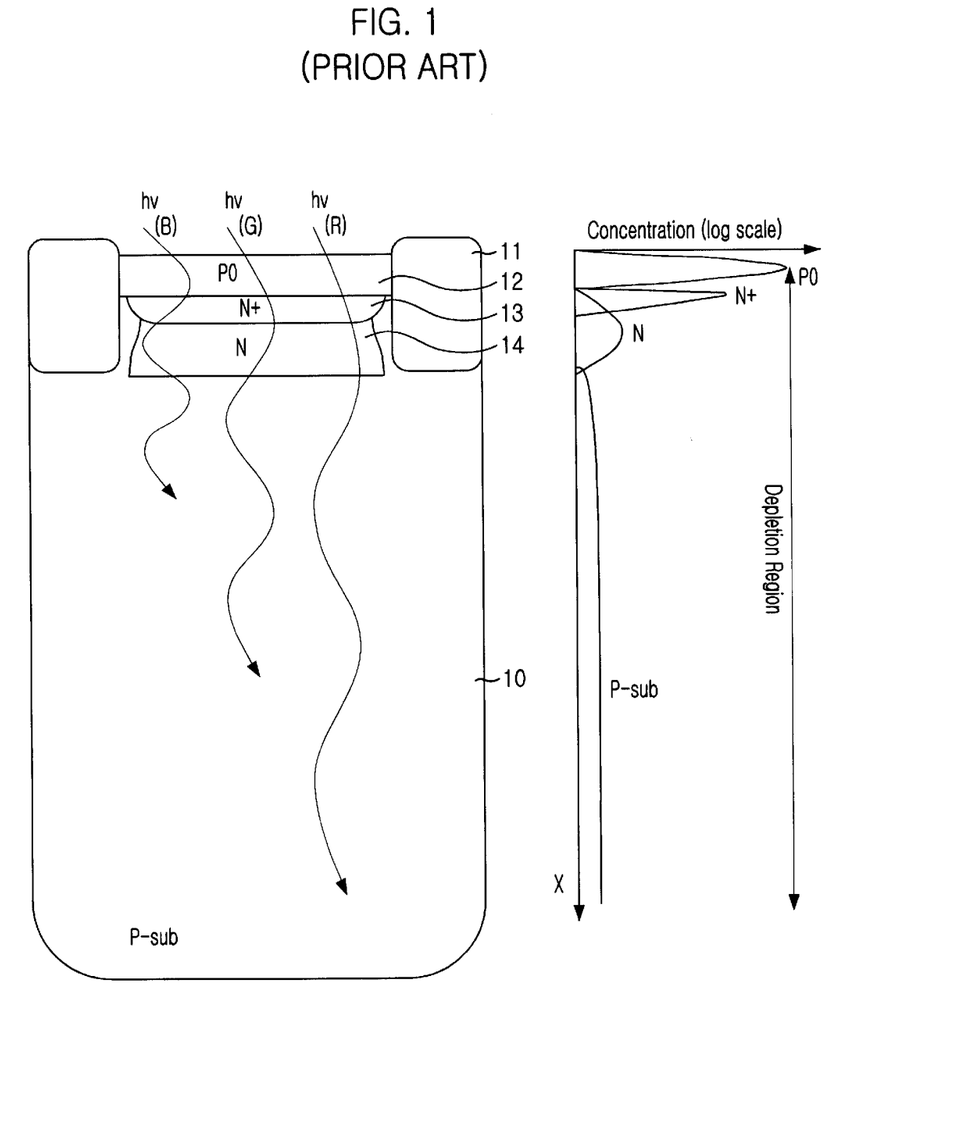
FIG. 1 is a diagram showing a cross-sectional view of a photodiode and a doping profile according to a conventional complementary metal-oxide semiconductor (CMOS) image sensor.

FIG. 1 is a cross-sectional view showing a photodiode formed in each unit pixel of a CMOS image sensor and a doping profile of ion implantation regions of the photodiode in accordance with a prior art.

Typically, a color image sensor has a plurality of arrayed pixels for red, green and blue colors. Hereinafter, a pixel for red is expressed as a red pixel and the same is applied for the other two colors. A photodiode of each pixel in accordance with the prior art has the identical structure for all red, green and blue pixels. Any one of three color filters (not shown) is formed on a top portion of this photodiode, and thus, each pixel is able to sense any one light among red, green and blue lights.

Referring to FIG. 1, among the red, green and blue lights, the blue light has the shortest penetration depth while the red light has the longest penetration depth. The red light is able to penetrate into neighboring pixels, and this ability further induces noises. The more detailed explanation on this effect will be provided in the following.

With reference to FIG. 1, a structure of a photodiode in accordance with a prior art will be described in detail. A field oxide layer 11 defining an active area and a field area is formed on a p-type substrate 10. Next, a p-type ion implantation region 12 is formed with a consistent depth from a surface of the p-type substrate 10.

Beneath the p-type ion implantation region 12, a first n-type ion implantation region 13 contacting to the p-type ion implantation region 12 is formed. Herein, the first n-type ion implantation region 13 has a high concentration and a consistent depth. A second n-type ion implantation region 14 contacting to the first n-type ion implantation region 13 with a consistent depth is formed beneath the first n-type ion implantation region 13. Herein, the second n-type ion implantation region 14 has a low concentration.

Generally, the field oxide layer 11 has a thickness ranging from about 0.3 μm to about 0.8 μm. Also, the second n-type ion implantation region 14 has a thickness in a range between about 0.3 μm and about 0.8 μm.

The p-type ion implantation region 12 formed on a near surface of the p-type substrate 10, the first n-type ion implantation region 13 formed below the p-type ion implantation region 12, the second n-type ion implantation region 14 and the p-type substrate 10 constitute a pn junction, constructing a p/n/p photodiode.

FIG. 1 provides another diagram showing a doping profile of the ion implantation regions measured in a logarithmic scale in accordance with the cross-sectional view of the photodiode illustrated in the left side of FIG. 1. This doping profile includes doping concentrations of the p-type ion implantation region P0 12, the first n-type ion implantation region N+ 13, the second n-type ion implantation region N 14 and the p-type substrate P-sub 10.

Also, this diagram shows a scale of a depletion region formed when a predetermined voltage is supplied to the pn junction having the above doping profile. It is indicated that the depletion region has a depth in several μ ms by being formed deeply into a deep region of the p-type substrate 10.

As well known, photodiode is a device that stores optical charges of light into the depletion region and uses the stored optical charges for generating an image as the photodiode supplies a predetermined voltage to the pn junction so that the depletion region is formed.

The photodiode constructed with a conventional structure has all identical depths for the red pixel, blue pixel and green pixel even though each color light has a different penetration depth. Therefore, since the depletion regions are formed even in deeper regions of the p-type substrate 10 of the blue pixel and the green pixel, red light penetrated into the neighboring red pixel induces light interference.

Furthermore, it is a current trend of increasing demands for developing a color image sensor that can be installed in a highly integrated and low power consuming mobile telecommunication terminal. However, this image sensor has a unit pixel of which size is decreased in about half of the conventional unit pixel. In case of applying the 0.18 μm technology, the unit pixel size is below about 4.0 μm×4.0 μm.

As the unit pixel size decreases, it is focused to solve such problems of a signal distortion with respect to the blue pixel and the green pixel caused by red light having a deep penetration depth and electric interference between neighboring pixels.

In case of using the 0.18 μm technology instead of using the generally used 0.5 μm or 0.35 μm technology, it is much difficult to isolate devices. Also, there is another difficulty when using the 0.18 μm technology as an allowable noise level decreases to about half of a conventional noise level.

Furthermore, in case of employing the 0.18 μm technology, the photodiode area decreases below about 70%, and a driving voltage also decreases below about 75% compared to the area acquired when using the 0.35 μm technology. Therefore, efficiency on optical charge generation is expected to be below 50% compared to the 0.35 μm technology.

In order to compensate the efficiency on optical charge generation, it is essential to increase ion implantation energy and ion implantation concentration so to increase generations of an electron-hole pair. However, this increase in the ion implantation energy conversely decreases an insulating distance between pn junctions of nearly located photodiodes. Hence, there occur electric noises between nearly located pixels due to a weakened insulating characteristic. For this reason, it is much emphasized to compensate the insulating characteristic.

SUMMARY OF THE INVENTION

It is, therefore, an object of the present invention to provide a complementary metal-oxide semiconductor (CMOS) image sensor with decreased electric and optical noises and signal distortion between neighboring pixels and a method for fabricating the same.

In accordance with an aspect of the present invention, there is provided a complementary metal-oxide semiconductor (CMOS) image sensor, comprising: a first conductive type semiconductor substrate providing a first photodiode for sensing light having a first wavelength and a second photodiode for sensing light having a second wavelength, shorter than the first wave length, being closely located to the first photodiode, wherein each first and second photodiode includes: a first ion implantation region of a first conductive type formed in a semiconductor substrate of the first conductive type; a second ion implantation region of a second conductive type, contacting to a bottom surface of the first ion implantation region; a third ion implantation region of the second conductive type having a concentration lower than the second ion implantation region, contacting to a bottom surface of the second ion implantation region; and a forth ion implantation region of the second conductive type having a concentration lower than the second ion implantation region, contacting to a bottom surface of the third ion implantation region; and wherein the second photodiode includes a fifth ion implantation region of a first conductive type, surrounding lateral surfaces of the third and the fourth ion implantation regions and contacting to a bottom surface of the fourth ion implantation region and having a concentration higher than the third and the fourth ion implantation regions.

In accordance with another aspect of the present invention, there is also provided a complementary metal-oxide semiconductor (CMOS) image sensor, comprising: a first conductive type semiconductor substrate providing a first photodiode for sensing light having a first wavelength, a second photodiode for sensing light having a second wavelength, shorter than the first wave length, a third photodiode for sensing light having a third wavelength, shorter than the second wave length, being closely located to the first photodiode, wherein the first photodiode includes: a first ion implantation region of a first conductive type formed in a semiconductor substrate of the first conductive type; a second ion implantation region of a second conductive type, contacting to a bottom surface of the first ion implantation region; a third ion implantation region of the second conductive type having a concentration lower than the second ion implantation region, contacting-to a bottom surface of the second ion implantation region; and a forth ion implantation region of the second conductive type having a concentration lower than the second ion implantation region, contacting to a bottom surface of the third ion implantation region; and wherein the second photodiode includes: a fifth ion implantation region of a first conductive type formed in a semiconductor substrate of the first conductive type; a sixth ion implantation region of a second conductive type, contacting to a bottom surface of the fifth ion implantation region; a seventh ion implantation region of the second conductive type having a concentration lower than the sixth ion implantation region, contacting to a bottom surface of the sixth ion implantation region; a eighth ion implantation region of the second conductive type having a concentration lower than the sixth ion implantation region, contacting to a bottom surface of the seventh ion implantation region; and a ninth ion implantation region of a first conductive type, surrounding lateral surfaces of the seventh and the eighth ion implantation regions and contacting to a bottom surface of the eighth ion implantation region, and having a concentration higher than the seventh and the eighth ion implantation regions; and wherein the third photodiode includes: a tenth ion implantation region of a first conductive type formed in a semiconductor substrate of the first conductive type; a eleventh ion implantation region of a second conductive type, contacting to a bottom surface of the tenth ion implantation region; a twelfth ion implantation region of the second conductive type having a concentration lower than the eleventh ion implantation region, contacting to a bottom surface of the eleventh ion implantation region; a thirteenth ion implantation region of the first conductive type having a concentration lower than the twelfth ion implantation region, contacting to a bottom surface of the twelfth ion implantation region; and a fourteenth ion implantation region of a first conductive type, surrounding lateral surfaces of the twelfth and the thirteenth ion implantation regions and contacting to a bottom surface of the thirteenth ion implantation region, and having a concentration higher than the twelfth ion implantation region.

In accordance with further aspect of the present invention, there is also provided a method for forming a CMOS image sensor, wherein the CMOS image sensor including: a first photodiode for sensing light having a first wavelength; a second photodiode for sensing light having a second wavelength being closely located to the first photodiode, the method comprising the steps of: forming a field oxide layer on a substrate thereby defining an active area and; forming a fifth ion implantation region of a first conductive type in a second photodiode area provided in the substrate; expanding the fifth ion implantation region through a thermal process; forming first ion implantation regions of the first conductive type in areas of the first and the second photodiodes; forming forth ion implantation regions of a second conductive type in areas of the first and the second photodiodes, the forth ion implantation regions being deeper than the first ion implantation region but shallower than the fifth ion implantation region and having a concentration lower than the fifth ion implantation region; forming third ion implantation regions of the second conductive type in areas of the first and the second photodiodes, the third ion implantation regions being deeper than the first ion implantations region but shallower than the forth ion implantation region and having a concentration lower than the fifth ion implantation region; and forming second ion implantation region of the second conductive type in areas of the first and the second photodiodes, the second ion implantation regions formed in between the first ion implantation region and the third ion implantation region.

The present invention provides a preferred embodiment, wherein a photodiode structure of a red pixel is different from the photodiode structure of a blue and a green pixel. This differently structured photodiode decreases electric and optical noises occurring between neighboring pixels as simultaneously as improves light sensitivity.

In another preferred embodiment of the present invention, each of the red, blue and green pixels has different photodiode structure. Therefore, it is possible to optimize the photodiode structure for each light having a different color. As a result of this optimization, it is further possible to improve light sensitivity as simultaneous as to decrease signal interference between neighboring pixels.

BRIEF DESCRIPTION OF THE DRAWING (S)

The above and other objects and features of the present invention will become apparent from the following description of the preferred embodiments given in conjunction with the accompanying drawings, in which.

DETAILED DESCRIPTION OF THE INVENTION

As an image sensor becomes increasingly micronized with low power dissipation, amounts of light incident to a unit pixel and a driving voltage level for processing the incident light into image data with use of an optical signal decrease.

Inevitably, light sensitivity also decreases due to decreases in the amounts of incident light and the driving voltage level. To compensate this problem, a concentration of a p-type or an n-type ion implantation region constituting a photodiode increases to increase generations of an electron-hole pair. However, as the ion implantation concentration increases, the interference phenomenon between neighboring pixels of a highly integrated image sensor conversely increases.

To solve the above problem, the present invention makes use of a skin depth difference due to a wavelength difference between red, green and blue lights. Herein, Skin Depth= (refraction index/electric conductivity)×(2π/wavelength).

Since amounts of light penetration decrease exponentially in accordance with a depth, light sensitivity increases as the ion concentration of the ion implantation region existing in about 0~0.5 μm of silicon surface.

It is known that the blue light is not able to penetrate a depth above about 0.5 μm from the silicon surface. The green light is unable to penetrate a depth above 1.5 μm from the silicon surface. Therefore, a depletion region of a photodiode having a blue pixel and a green pixel is preferably formed in about 0~1.5 μAm of depth from the silicon surface.

Even if the depletion region is expanded beyond the above depth, it does not contribute to an improvement on light sensitivity due to inability of the blue light and the green light to penetrate. The expansion of the depletion region rather brings a problem of decreasing the light sensitivity due to a decreased intensity of an electric field.

In case of the red light, it has a penetration depth ranging between about 1.5 μm and about 3.0 μm measured from the silicon surface. Therefore, it is preferable to form the depletion region in about 0~3.0 μm of the penetration depth to use all incident red lights. However, the depletion region in accordance with the prior art is formed in about several μm to sense red, green and blue lights.

Figure 2:
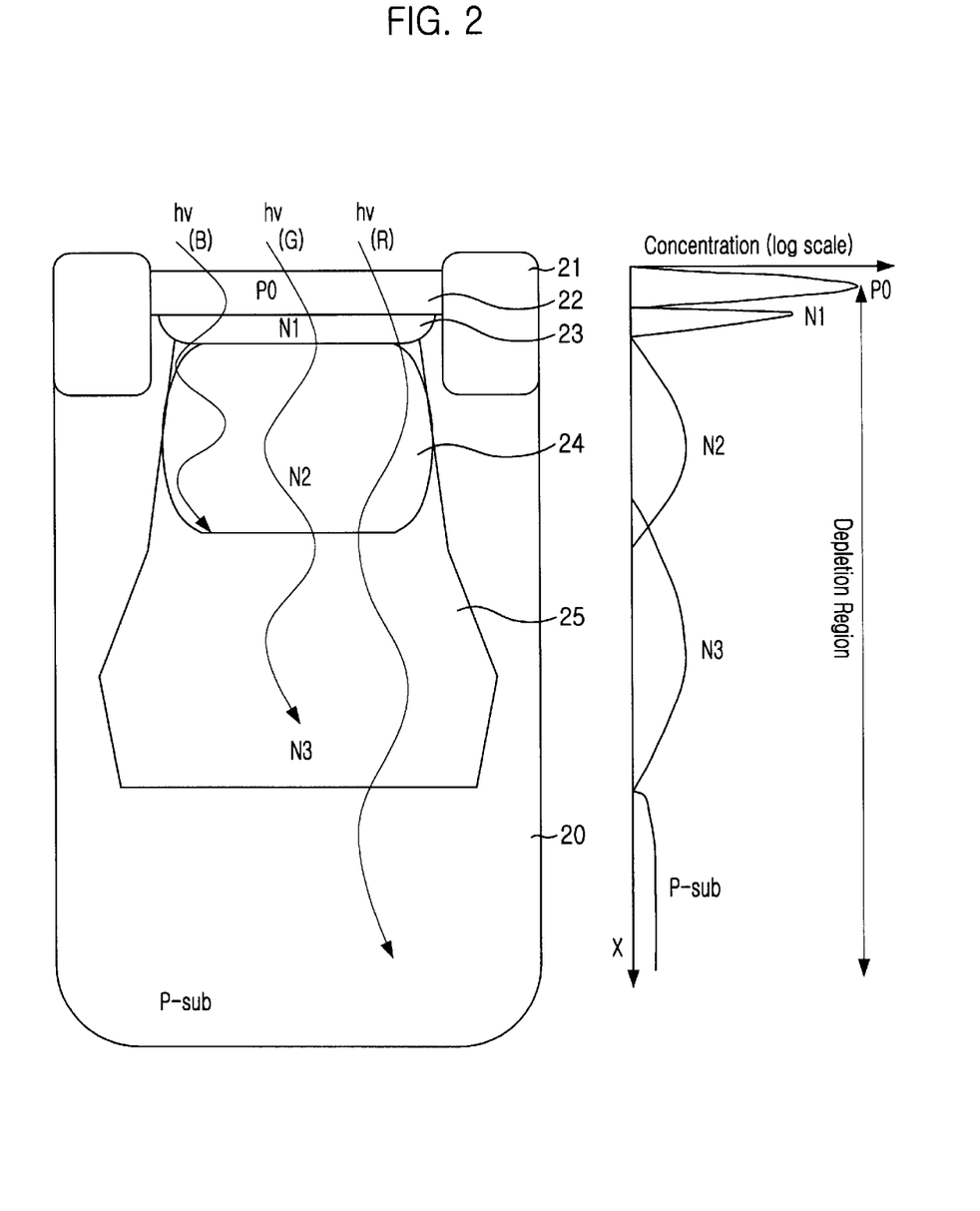
FIG. 2 is a diagram showing a cross-sectional view of a photodiode of a red pixel and a doping profile in a CMOS image sensor in accordance with a preferred embodiment of the present invention.

FIG. 2 is a diagram showing a cross-sectional view of a photodiode of a red pixel in a CMOS image sensor and a doping profile based on the cross-sectional view of the photodiode of the red pixel in accordance with a preferred embodiment of the present invention. The photodiode of the red pixel increases a doping concentration of a conventional n-type ion implantation region, and forms additionally a new n-type ion implantation region so to improve light sensitivity by increasing a depth of the depletion region.

With reference to FIG. 2, the photodiode of the red pixel includes a field oxide layer 21 formed on a p-type substrate 20 so to define an active area and a field area, a high concentration of a first p-type ion implantation region 22 formed by being expanded with a uniform depth from a surface of the p-type substrate 20, a high concentration of a first n-type ion implantation region 23 contacting to the first p-type ion implantation region 22 and being formed beneath the first p-type ion implantation region 22 with a predetermined depth, a low concentration of a second n-type ion implantation 24 contacting to the first n-type ion implantation region 23 and being formed beneath the first n-type ion implantation region 23 with a predetermined depth and a low concentration of a third n-type ion implantation region 25 formed beneath the second n-type ion implantation region 24 and encompassing the second n-type ion implantation region 24 as being expanded to have a larger cross-sectional area than the second n-type ion implantation region 24.

As mentioned the above, red light has a deep penetration depth. Hence, it is required to expand the depletion region into a deep region of the p-type substrate 20 and use an optical charge generated by the red light so as to use all red lights incident to the red pixel. Therefore, in the preferred embodiment of the present invention, the depletion region is expanded by additionally forming the deep third n-type ion implantation region 25.

Additionally, a concentration of the ion implantation region cannot be increased in the prior art due to increasing noises. However, the preferred embodiment of the present invention provides a mechanism for decreasing the noise. Accordingly, it is possible to improve the light sensitivity with respect to the red light by increasing a concentration of impurities contained in the ion implantation region. The mechanism for decreasing the noise will be described with respect to the green pixel and the blue pixel.

FIG. 2 also shows a doping profile of each ion implantation region illustrated in the cross-sectional view of the photodiode structure of the red pixel. A doping concentration of the additionally formed third n-type ion implantation region 25 is higher than that of the p-type substrate 20 but lower than that of the first n-type ion implantation region 23. Also, a doping concentration of the second n-type ion implantation region 24 is very similar to that of the third n-type ion implantation region 25.

With respect to the photodiode structure formed in the blue and the green pixels, amounts of the impurities doped onto the ion implantation region are increased in the preferred embodiment of the present invention. Also, a high concentration of a p+ ion implantation region expanding into the deep region of the p-type substrate 20 as encompassing the n-type ion implantations is formed so to reduce electrical and optical interference between neighboring pixels.

Figure 3:
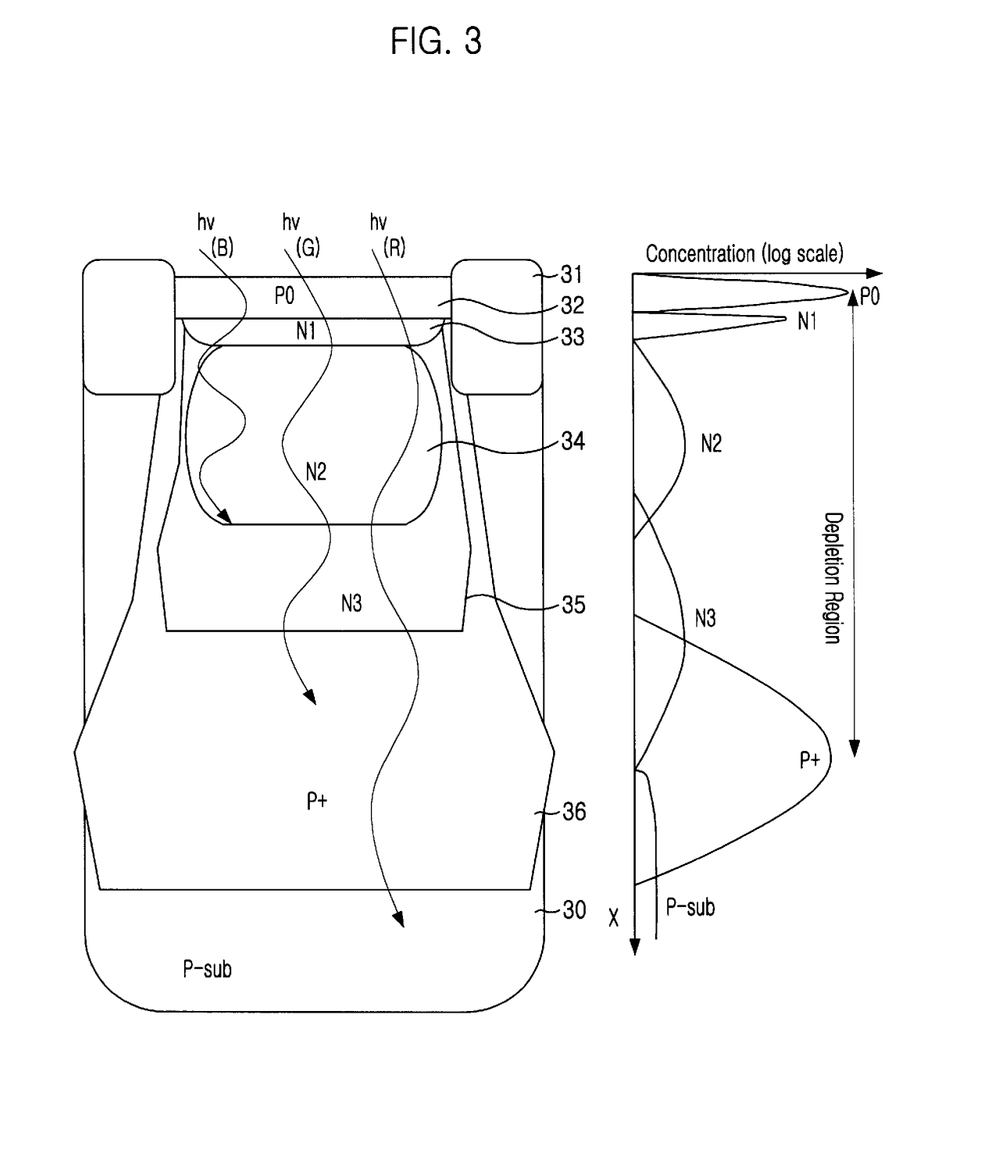
FIG. 3 is diagram showing a cross-sectional view of a photodiode of a blue or green pixel and a doping profile in the CMOS image sensor in accordance with the preferred embodiment of the present invention.

FIG. 3 is a diagram showing a cross-sectional view of a photodiode of a blue or green pixel in the CMOS image sensor and a doping profile based on the cross-sectional view of the photodiode in accordance with the preferred embodiment of the present invention.

Referring to FIG. 3, the photodiode having the green pixel or the blue pixel includes a field oxide layer 31 formed on a p-type substrate 30 so to define an active area and a field area, a high concentration of a first p-type ion implantation region 32 formed by being expanded with a uniform depth from a surface of the p-type substrate 30, a high concentration of a first n-type ion implantation region 33 contacting to the first p-type ion implantation region 32 and being formed beneath the first p-type ion implantation region 32 with a predetermined depth, a low concentration of a second n-type ion implantation 34 contacting to the first n-type ion implantation region 33 and being formed beneath the first n-type ion implantation region 33 with a predetermined depth, a low concentration of a third n-type ion implantation region 35 formed beneath the second n-type ion implantation region 34 and expanded to have a larger cross-sectional area than the second n-type ion implantation region 34 and a high concentration of a second p-type ion implantation region 36 formed as being expanded into a deeper region of the third n-type ion implantation region 35 and encompassing the second n-type ion implantation region 34 and the third n-type ion implantation region 35.

The photodiode having the green or blue pixel in accordance with the preferred embodiment of the present invention increases doping concentrations of the p-type ion implantation region and the n-type ion implantation region. In addition, formation of the highly concentrated second p-type ion implantation region limits a depth of a depletion region to a penetration depth of green light, thereby improving light sensitivity.

That is, in addition to the increase of the doping concentration, the photodiode of the green or blue pixel in accordance with this preferred embodiment has other unique characteristics in that the second p-type ion implantation region 36 with a high concentration is formed as encompassing the second and the third n-type ion implantation regions 34 and 35 existing on top of the second p-type ion implantation region 36. Also, the size of the depletion region is decreased due to the existence of the highly concentrated second p-type ion implantation region 36.

In the photodiode of the green or blue pixel, the second p-type ion implantation region 36 is formed by using ion implantation energy ranging from about 400 Kev to about 2 MeV. Also, the p-type substrate 30 can use a Si, Ge, GaAs, InSb or AlAs wafer.

With reference to FIG. 3, the doping profile of the photodiode of the green or blue pixel shows that the size of the depletion region is decreased due to the second p-type ion implantation region 36. In other words, since the green or the blue pixel does not need to sense red light, the depletion region does not exist at an inner portion of the p-type substrate 30 responsible for the penetration depth of the red light. Instead, the depletion region is formed up to the penetration depth of the green light.

Therefore, even if the red light incident to the red pixel penetrate to the neighboring green or blue pixel, a chance for generating optical charges due to the red light is reduced since the depletion region corresponding to the penetration depth of the red light does not exist in the green or blue pixel. Because of this specific structure of the photodiode, it is possible to suppress the optical interference phenomenon due to the red light.

Also, the electric field is increased and thus the light sensitivity improved, because the size of the depletion region is decreased due to the existence of the second p-type ion implantation region 36. The light sensitivity is more improved because the impurity concentration in the ion implantation region is more increased.

Furthermore, as described the above, the second p-type ion implantation region 36 is formed as encompassing the second and the third n-type ion implantation regions 34 and 35 existing on top of the second p-type ion implantation 36. That is, if the pixels are specifically arrayed in such that the green or blue pixel two-dimensionally encompasses the red pixel, it is possible to decrease the electric/optical interference phenomenon occurring between the neighboring pixels.

Figure 4:
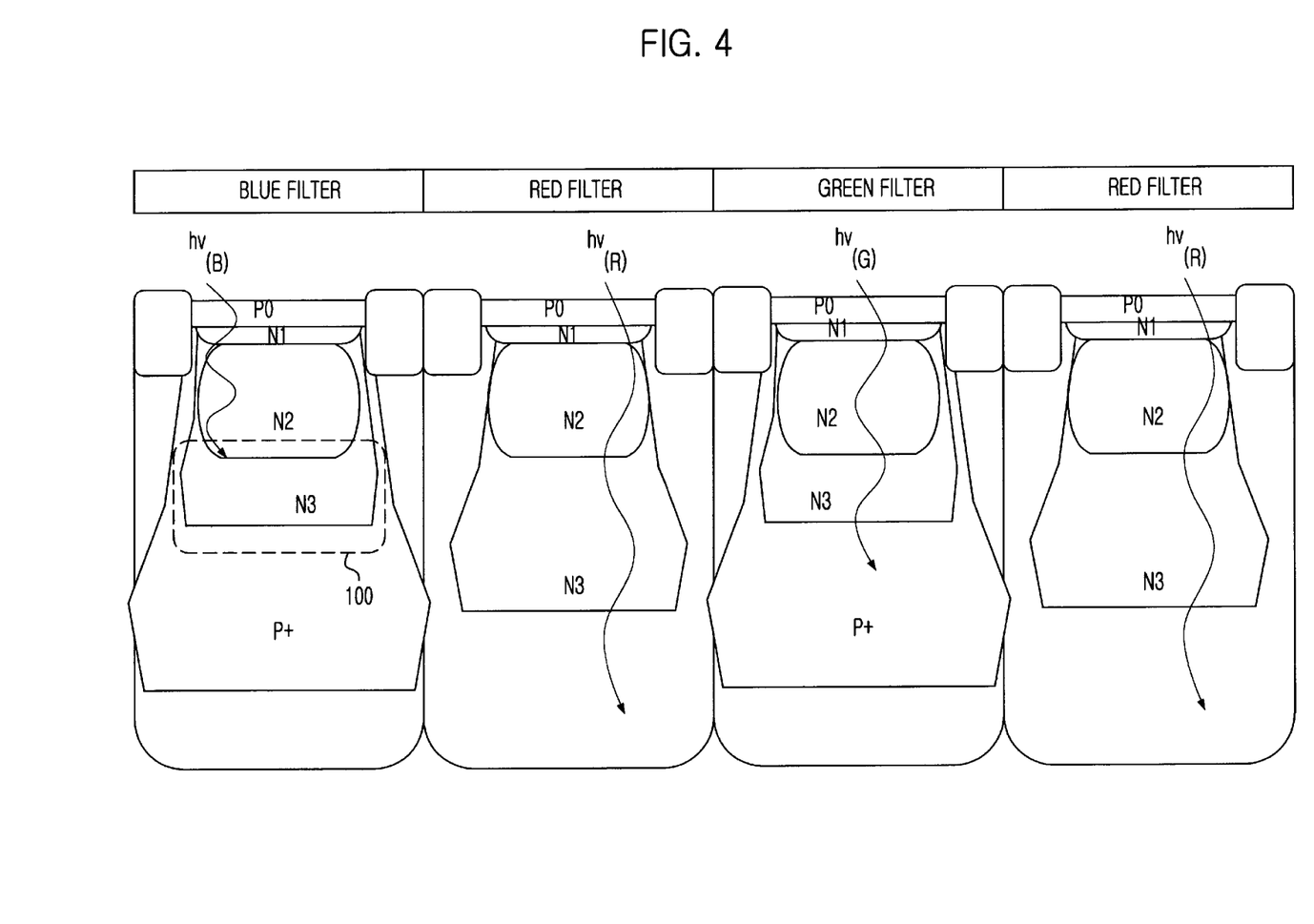
FIG. 4 shows cross-sectional views of each photodiode for each red, blue and green pixel in a CMOS image sensor in accordance with another preferred embodiment of the present invention.
Figure 5:
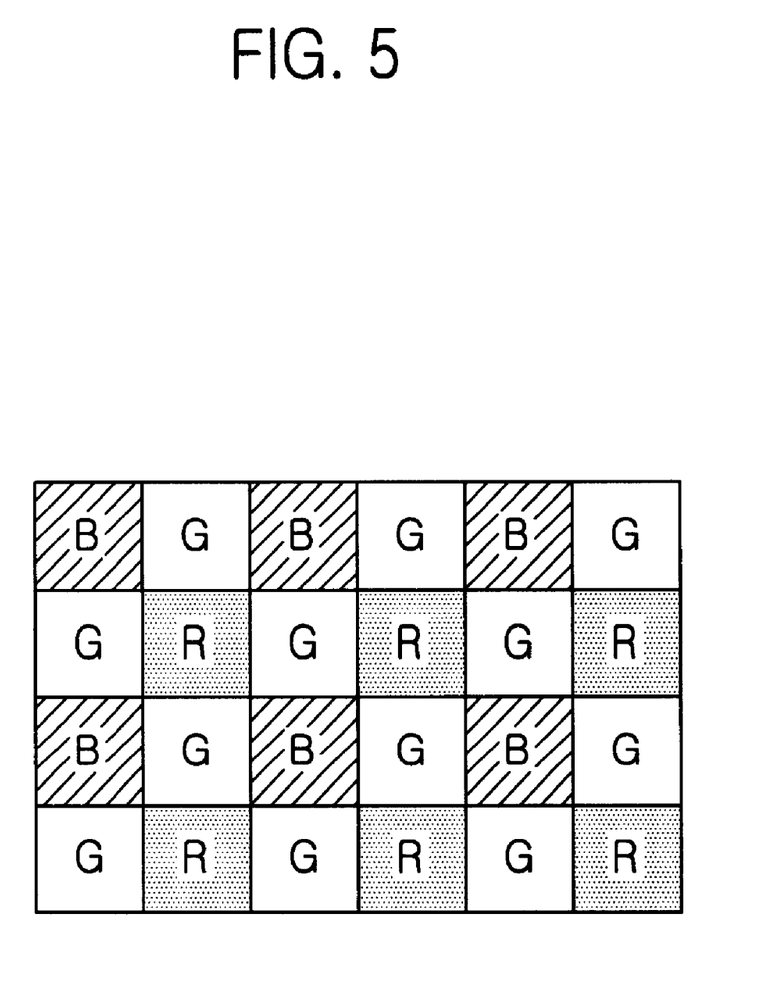
FIG. 5 is a plane view showing a pixel array.

FIG. 4 shows a diagram for describing a mechanism for reducing the electric/optical interference phenomenon between the neighboring pixels in accordance with the present invention. FIG. 5 is a plane view showing a pixel array.

Referring to FIG. 4, the red pixel is encompassed by the green pixel or the blue pixel. This array structure is further illustrated in the pixel array in FIG. 5; the red filter is encompassed two-dimensionally by the blue pixel or the green pixel.

In other words, the high concentration of the second p-type ion implantation region of the green or blue pixel, which is denoted as P+ in the green or blue pixel in FIG. 4, encompasses the n-type ion implantation regions of the red pixel in all directions. Herein, the n-type ion implantation regions are denoted as N2 and N3 in FIG. 4. Therefore, the n-type ion implantation region of the red pixel is electrically insulated with the n-type ion implantation region of the blue or green pixel.

As a result, even if the ion implantation concentration is increased for improving the light sensitivity of the image sensor, it is still possible to reduce noises generated in between the neighboring pixels.

Although the preferred embodiment of the present invention describes an example of the pixel array, it is still possible to attain the identical effect as the above as long as the arrayed pixel closely located at the red pixel is either the green pixel or the blue pixel.

In accordance with another preferred embodiment of the present invention, a third p-type ion implantation region 100 (refer to FIG. 4) relates to a structure of the blue pixel. In the above-preferred embodiment of the present invention, the blue pixel and the green pixel use the same photodiode. However, the photodiode is more optimized for the green pixel. Thus, in this preferred embodiment, the photodiode optimized for the blue pixel is separately formed in addition to the photodiode of the green pixel, thereby further increasing the light sensitivity.

Referring to FIG. 4, blue light has the shortest penetration depth among red, blue and green lights. In the blue pixel for capturing blue light, the depletion region should be formed with a shallow depth to enhance light sensitivity to the blue light.

Hence, in case of performing an ion implantation process for forming the third p-type ion implantation region 100 only in the blue pixel, the size of a second n-type ion implantation region denoted as N2 in the blue pixel shown in FIG. 4 is decreased, further resulting in a decrease in the size of the depletion region. As a result of these decreased sizes, it is possible to obtain the blue pixel optimized to the blue light that has the shortest penetration depth, thereby enhancing the light sensitivity to the blue light.

An ion implantation process for forming a third n-type ion implantation region N3 in the blue pixel illustrated in FIG. 4 is proceeded after performing the ion implantation process for forming the third p-type ion implantation region 100. However, if the concentration of the third p-type ion implantation region 100 is set to be high, it is also possible to obtain the third p-type ion implantation region 100 having a concentration similar to or lower than the concentration of the second p-type ion implantation region P+ even after completing the ion implantation process for forming the third n-type ion implantation region N3.

Next, with reference to FIG. 4, a method for forming a CMOS image sensor in accordance with a preferred embodiment of the present invention will be described. A field oxide layer defining an active area and a field area is formed on a substrate. Then, a high concentration of a second p-type ion implantation region P+ is formed in a photodiode region constructed in the green pixel and the blue pixel. When forming the second p-type ion implantation region P+, about 400 KeV to about 2 MeV of ion implantation energy is used. Also, even if the red light penetrates to the green pixel and the green pixel, the second p-type ion implantation region P+ acts to prevent the depletion region of the red light from being formed in an effective penetration depth.

Next, a process for forming a gate electrode (not shown) is carried out. The detailed description on this process will be omitted since it follows the known conventional scheme. Typically, the gate electrode formation process is accompanied with a thermal process. Even after completely forming the gate electrode, an additional thermal process is performed for stabilizing an interface. The second p-type ion implantation region P+ is sufficiently diffused through the thermal process so to encompass the n-type ion implantation regions N2 and N3, which will be formed in a subsequent process.

A first p-type ion implantation region P0 is formed in each photodiode region of the red, green and blue pixels. In particular, the first p-type ion implantation region P0 is formed in a consistent depth by being expanded from a surface of the substrate. Then, the third n-type ion implantation region N3 is formed in the each photodiode region of all the mentioned pixels. However, the third n-type ion implantation region N3 is deeper than the first p-type ion implantation region P0 and deeper than the second n-type ion implantation region N2. Also, a concentration of the third n-type ion implantation region N3 is lower than the second p-type ion implantation region P+.

The second n-type ion implantation region N2 is formed also in each photodiode region of the red, blue and green pixels. The second n-type ion implantation region N2 is deeper than the first p-type ion implantation region P0 but shallower than the third n-type ion implantation region N3. Also, a concentration of the second n-type ion implantation region N2 is lower than the second p-type ion implantation region P+.

Subsequently, a first n-type ion implantation region N1 is formed in the each photodiode region of the red, green and blue pixels. In particular, the first n-type ion implantation region N1 is formed in between the first p-type ion implantation region P0 and the second n-type ion implantation region N2.

If the three pixels are formed through the above processes, the second p-type ion implantation region P+ suppresses the electric/optical interference and also insulates electrically the n-type ion implantation regions N1, N2 and N3 of the neighboring pixels so to prevent generation of noises even in case of increasing the doping concentration.

The blue light has the most shallow penetration depth among the three lights. In order to obtain a pixel optimized to the blue light, the third p-type ion implantation region 100 is additionally formed in the blue pixel.

The third p-type ion implantation region 100 is formed beneath the second n-type ion implantation region N2 and has a decreased depth of the depletion region so as to optimize to the blue light of which penetration depth is shallow. The third p-type ion implantation region 100 also decreases the size of the second n-type ion implantation region N2 so to decrease the depth of the depletion region.

The third p-type ion implantation region 100 as described in the above can be formed before and after the two thermal processes. That is, the third p-type ion implantation region 100 can be formed after forming a high concentration of the second p-type ion implantation region P+ or before forming the gate electrode. Alternatively, the third p-type ion implantation region 100 can be formed after forming the gate electrode or before proceeding the thermal process for stabilizing the interface. After performing the thermal process for stabilizing the interface, the third p-type ion implantation region 100 can be formed before forming the third n-type ion implantation region N3.

In case of forming the photodiodes each being optimized for each color pixel, manufacturing costs increase, yet light sensitivity increases in more extents.

By following the preferred embodiments of the present invention, it is possible to reduce the interference phenomenon occurring between neighboring pixels and noises due to red light. It is also possible to improve light sensitivity.

While the present invention has been described with respect to certain preferred embodiments, it will be apparent to those skilled in the art that various changes and modifications may be made without departing from the scope of the invention as defined in the following claims.

What is claimed is:

1. A complementary metal-oxide semiconductor (CMOS) image sensor, comprising:
   a first conductive type semiconductor substrate providing a first photodiode for sensing light having a first wavelength and a second photodiode for sensing light having a second wavelength, shorter than the first wavelength, being closely located to the first photodiode, wherein each first and second photodiode includes:
   a first ion implantation region of a first conductive type formed in a semiconductor substrate of the first conductive type;
   a second ion implantation region of a second conductive type, contacting to a bottom surface of the first ion implantation region;

a third ion implantation region of the second conductive type having a concentration lower than the second ion implantation region, contacting to a bottom surface of the second ion implantation region; and a fourth ion implantation region of the second conductive type having a concentration lower than the second ion implantation region, contacting to a bottom surface of the third ion implantation region;

and wherein the second photodiode includes a fifth ion implantation region of a first conductive type, surrounding lateral surfaces of the third and the fourth ion implantation regions and contacting to a bottom surface of the fourth ion implantation region and having a concentration higher than the third and the fourth ion implantation regions.

2. The CMOS image sensor as recited in claim 1, wherein the fourth ion implantation region of the second photodiode is formed to have a depth shallower than the fourth ion implantation region of the first photodiode.

3. The CMOS image sensor as recited in claim 1, wherein the light having the first wavelength is red light.

4. The CMOS image sensor as recited in claim 1, wherein the light having the second wavelength is green light.

5. The CMOS image sensor as recited in claim 1, wherein the light having the second wavelength is blue light.

6. A complementary metal-oxide semiconductor (CMOS) image sensor, comprising:

a first conductive type semiconductor substrate providing a first photodiode for sensing light having a first wavelength, a second photodiode for sensing light having a second wavelength, shorter than the first wavelength, a third photodiode for sensing light having a third wavelength, shorter than the second wave length, being closely located to the first photodiode, wherein the first photodiode includes:

a first ion implantation region of a first conductive type formed in a semiconductor substrate of the first conductive type;

a second ion implantation region of a second conductive type, contacting to a bottom surface of the first ion implantation region;

a third ion implantation region of the second conductive type having a concentration lower than the second ion implantation region, contacting to a bottom surface of the second ion implantation region; and a fourth ion implantation region of the second conductive type having a concentration lower than the second ion implantation region, contacting to a bottom surface of the third ion implantation region;

and wherein the second photodiode includes:

a fifth ion implantation region of a first conductive type formed in a semiconductor substrate of the first conductive type;

a sixth ion implantation region of a second conductive type, contacting to a bottom surface of the fifth ion implantation region;

a seventh ion implantation region of the second conductive type having a concentration lower than the sixth ion implantation region, contacting to a bottom surface of the sixth ion implantation region;

a eighth ion implantation region of the second conductive type having a concentration lower than the sixth ion implantation region, contacting to a bottom surface of the seventh ion implantation region; and a ninth ion implantation region of a first conductive type, surrounding lateral surfaces of the seventh and the eighth ion implantation regions and contacting to a bottom surface of the eighth ion implantation region, and having a concentration higher than the seventh and the eighth ion implantation regions;

and wherein the third photodiode includes:

a tenth ion implantation region of a first conductive type formed in a semiconductor substrate of the first conductive type;

a eleventh ion implantation region of a second conductive type, contacting to a bottom surface of the tenth ion implantation region;

a twelfth ion implantation region of the second conductive type having a concentration lower than the eleventh ion implantation region, contacting to a bottom surface of the eleventh ion implantation region;

a thirteenth ion implantation region of the first conductive type having a concentration lower than the twelfth ion implantation region, contacting to a bottom surface of the twelfth ion implantation region; and a fourteenth ion implantation region of a first conductive type, surrounding lateral surfaces of the twelfth and the thirteenth ion implantation regions and contacting to a bottom surface of the thirteenth ion implantation region, and having a concentration higher than the twelfth ion implantation region.

7. The CMOS image sensor as recited in claim 6, wherein the first photodiode, the second photodiode and the third photodiode sense red light, green light and blue light, respectively.

8. The CMOS image sensor as recited in claim 6, wherein the twelfth ion implantation region is shallower than the seventh ion implantation region.

9. A method for forming a CMOS image sensor, wherein the CMOS image sensor including: a first photodiode for sensing light having a first wavelength; a second photodiode for sensing light having a second wavelength being closely located to the first photodiode, the method comprising the steps of:

forming a field oxide layer on a substrate thereby defining an active area and;

forming a fifth ion implantation region of a first conductive type in a second photodiode area provided in the substrate;

expanding the fifth ion implantation region through a thermal process;

forming first ion implantation regions of the first conductive type in areas of the first and the second photodiodes;

forming forth ion implantation regions of a second conductive type in areas of the first and the second photodiodes, the forth ion implantation regions being deeper than the first ion implantation region but shallower than the fifth ion implantation region and having a concentration lower than the fifth ion implantation region;

forming third ion implantation regions of the second conductive type in areas of the first and the second photodiodes, the third ion implantation regions being deeper than the first ion implantations region but shallower than the forth ion implantation region and having a concentration lower than the fifth ion implantation region; and forming second ion implantation region of the second conductive type in areas of the first and the second photodiodes, the second ion implantation regions formed in between the first ion implantation region and the third ion implantation region.

10. The method as recited in claim 9, wherein the forth ion implantation region and the third ion implantation region are formed in the fifth ion implantation region.

11. The method as recited in claim 9, wherein the fifth ion implantation region is formed through the use of ion implantation energy ranging from about 400 KeV to about 2 MeV.

12. The method as recited in claim 9, wherein the step of expanding the fifth ion implantation region is carried out by using a thermal process for forming a gate electrode and an additional thermal process for stabilizing an interface, and wherein the first photodiode senses red light and the second photodiode senses blue light or green light.

13. The method as recited in claim 12, further comprising the step of forming a sixth ion implantation region of the first conductive type in the second photodiode region for sensing blue light, the sixth ion implantation region being shallower than the fifth ion implantation region.

14. The method as recited in claim 13, wherein the sixth ion implantation region is formed before proceeding the thermal process for forming the gate electrode.

15. The method as recited in claim 13, wherein the sixth ion implantation region is formed after the thermal process for forming the gate electrode and before the additional thermal process for stabilizing the interface.

16. The method as recited in claim 13, wherein the sixth ion implantation region is formed after performing the additional thermal process for stabilizing the interface.

* * * * *

UNITED STATES PATENT AND TRADEMARK OFFICE
CERTIFICATE OF CORRECTION

PATENT NO. : 6,756,618 B2  Page 1 of 1
APPLICATION NO. : 10/334065
DATED : June 29, 2004
INVENTOR(S) : Hong

It is certified that error appears in the above-identified patent and that said Letters Patent is hereby corrected as shown below:

Title Page;
On the face of the patent, at [30] Foreign Application Priority Data, the date which is set forth as "Nov. 4, 2002" should read -- Nov. 14, 2002 --. As such, the complete line regarding the Foreign Application Priority Data should read as follows:

Nov. 14, 2002 [KR] ......................................... 2002-70768

Signed and Sealed this

Twenty-fifth Day of August, 2009

David J. Kappos
*Director of the United States Patent and Trademark Office*